(12) United States Patent
Redeau et al.

(10) Patent No.: US 9,728,249 B1
(45) Date of Patent: Aug. 8, 2017

(54) WORDLINE SHAPE ENHANCER

(71) Applicant: ARM Limited, Cambridge (GB)

(72) Inventors: Cédric Sacha Redeau, Grenoble (FR);
Nicolaas Klarinus Johannes van Winkelhoff, Grenoble (FR)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/093,470

(22) Filed: Apr. 7, 2016

(51) Int. Cl.
*G11C 11/00* (2006.01)
*G11C 11/419* (2006.01)
*G11C 13/00* (2006.01)
*G11C 5/10* (2006.01)

(52) U.S. Cl.
CPC .............. *G11C 11/419* (2013.01); *G11C 5/10* (2013.01); *G11C 13/0007* (2013.01)

(58) Field of Classification Search
CPC ..... G11C 11/412; G11C 11/413; G11C 11/41; G11C 7/1006
USPC .................................. 365/156, 154, 189.02
See application file for complete search history.

(56) References Cited

U.S. PATENT DOCUMENTS

| 2011/0267883 A1* | 11/2011 | Lee ...................... G11C 16/045 365/185.08 |
| 2015/0380081 A1* | 12/2015 | Wu ........................ G11C 11/419 365/154 |

* cited by examiner

*Primary Examiner* — Huan Hoang
(74) *Attorney, Agent, or Firm* — Pramudji Law Group PLLC; Ari Pramudji

(57) ABSTRACT

Various implementations described herein are directed to a circuit for memory applications. The circuit may include a data storage structure having column multiplexor transistors coupled to complementary bitlines. The circuit may include a wordline shape enhancer having a pair of passgate transistors coupled between the complementary bitlines and a capacitive load.

19 Claims, 6 Drawing Sheets

WORDLINE SHAPE ENHANCER

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits may be configured as memory circuits to store and access data. Memory circuits may be configured as arrays of memory cells (or bitcells) arranged in columns and rows. As shown in FIG. 1, a conventional memory cell array 100 may include a number of memory cells 102A, 102B, ..., 102N in a first column 106A and a number of memory cells 104A, 104B, ..., 104N in a second column 106B. The memory cell array 100 may be implemented in a circuit with multiple column multiplexor (colmux) passgates, such as, e.g., p-type metal-oxide-semiconductor (PMOS) transistors PA0, PA1, PB0, PB1. The memory cells 102A, 102B, ..., 102N in the first column 106A may be selected or non-selected (i.e., activated or non-activated) when the first column mux passgates PA0, PA1 are selected or non-selected (i.e., activated or non-activated), and the memory cells 104A, 104B, ..., 104N in the second column 106B may be selected or non-selected (i.e., activated or non-activated) when second column mux passgates PB0, PB1 are selected or non-selected (i.e., activated or non-activated).

For instance, in reference to FIG. 1, the first column 106A represents a non-selected column with use of a non-select control signal NSEL, and the second column 106B represents a selected column with use of a select control signal SEL. Further, rows of memory cells may be accessed with a number of corresponding wordlines (e.g., WLA, WLB, ..., WLN). For instance, a first row of memory cells 102A, 104A, etc. may be accessed with a first corresponding wordline WLA, and further, a second row of memory cells 102B, 104B, etc. may be accessed with a second corresponding wordline WLB. Therefore, a particular data value may be accessed from a particular memory cell with activation of particular wordlines (e.g., WLA, WLB, ..., WLN) corresponding to selection of particular complementary bitlines (e.g., BLA/NBLA, BLB/NBLB). In some cases, the bitlines may be implemented in a second metal layer (Metal2), and the wordlines may be implemented in a third metal layer (Metal3). Further, each of the bitlines may be coupled to a sense amplifier 108.

In conventional memory architecture, a read operation of a bitcell is triggered by activation of a wordline (e.g., WLA, WLB, ..., WLN) connected to the bitcell's passgates (e.g., PA0/PA1, PB0/PB1). Thus, in this instance, a pull down device may start discharging the bitline. Since some bitcells share a same wordline (e.g., an entire row), the activation of the wordline may trigger the bitline discharge of all columns of bitcells coupled to this activated wordline. This is referred to as a parasitic read, since only one column may be read by activating the selected column's multiplexer and sense amplifier. In some cases, this parasitic read may translate in power inefficiency, e.g., depending on a number of columns shared by one sense amplifier, and this parasitic drop on non-active bitlines may translate to a slow wordline rising edge. Thus, in some cases, parasitic drop (together with normal, read-out drop) may cause the wordline rising to slowdown, due to the (physical existing) coupling bitline-wordline. Further, the same parasitic read may be present during a write operation because writing may involve activation of the wordline.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to a memory cell having a wordline shape enhancer that may be configured to use extra capacitance (e.g., dummy metal capacitance or MOS capacitance) coupled to non-active or non-selected bitlines, which may restrict or limit a voltage drop due to a parasitic read. For instance, disturbance caused by a parasitic voltage drop on a wordline rising edge may be reduced. In some cases, use of the wordline shape enhancer may result in a faster and cleaner wordline trigger signal that may allow a faster read and write and overall faster memory. Also, less margins may be involved, since the difference in speed between the first and last columns of the memory may be less. Thus, in some cases, an advantage of using wordline shape enhancer may include speed combined with a higher static noise margin (SNM).

Various implementations of a memory cell having a wordline shape enhancer will now be described in greater detail herein with reference to FIGS. 2A-3.

Figure 2A:
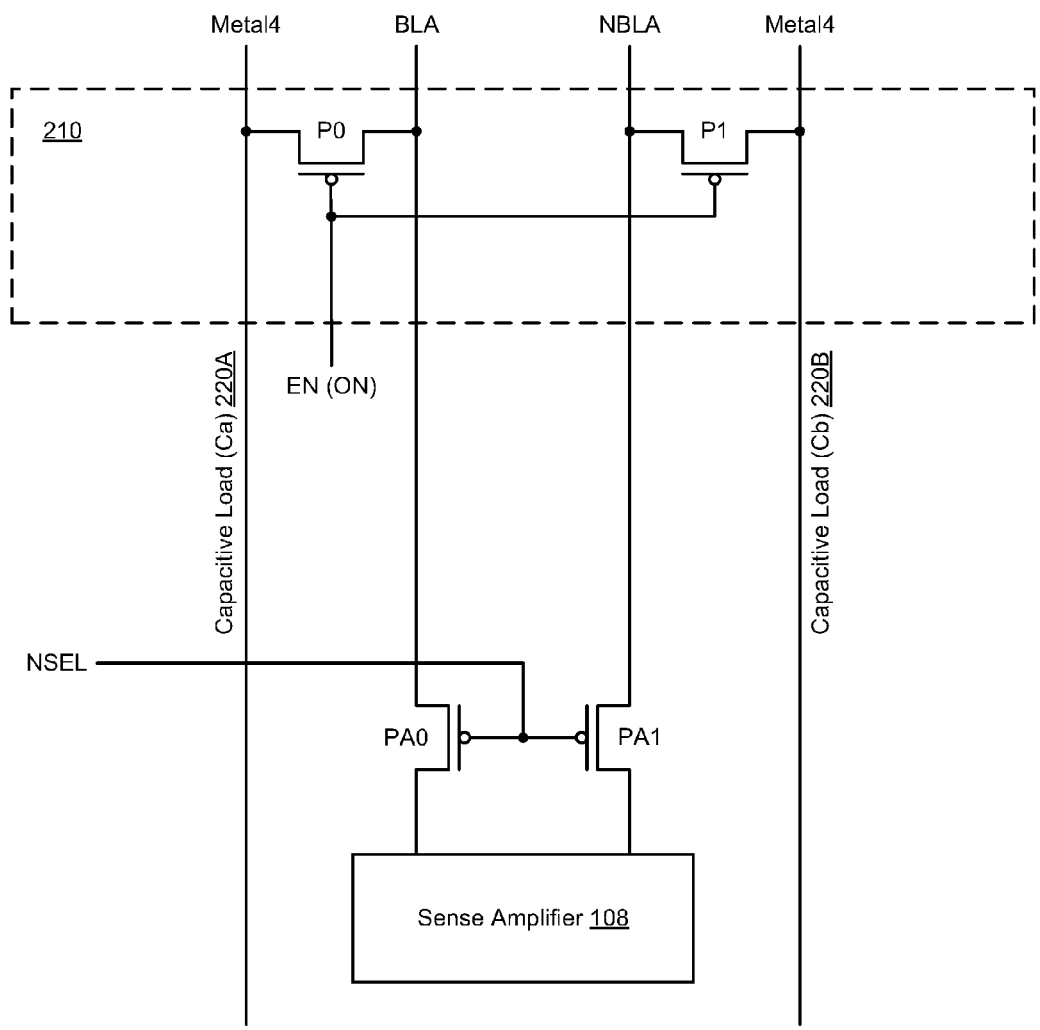
FIGS. 2A-2D illustrate various diagrams of a wordline shape enhancer in accordance with various implementations described herein.
Figure 2B:
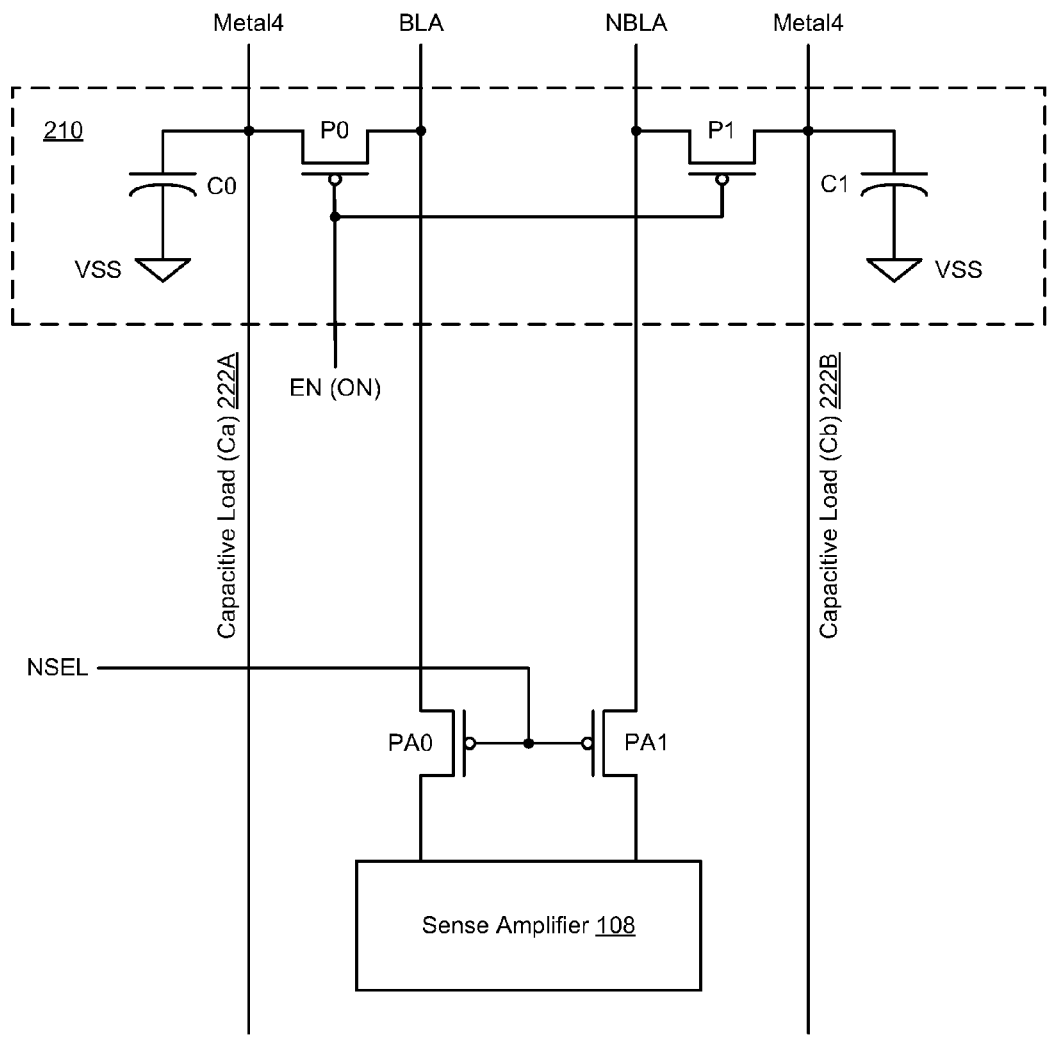
Figure 2C:
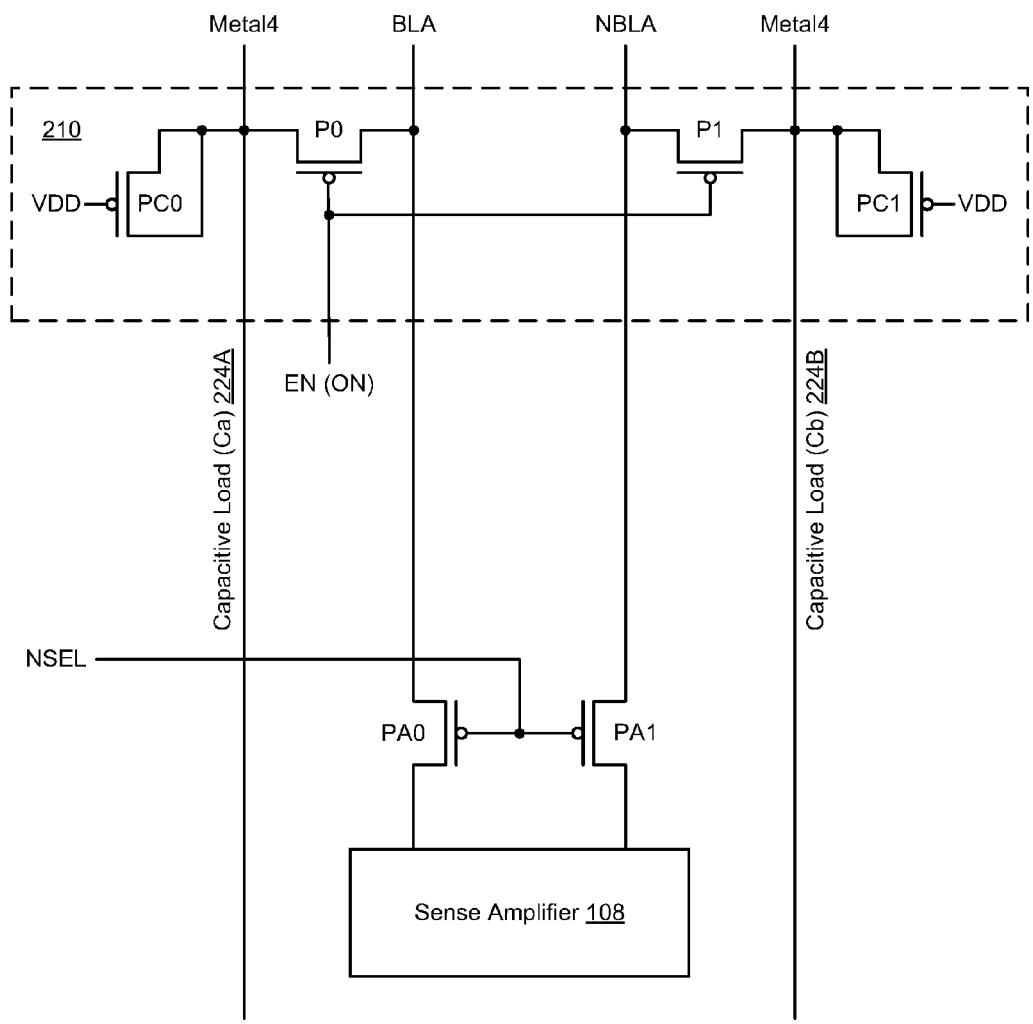
Figure 2D:
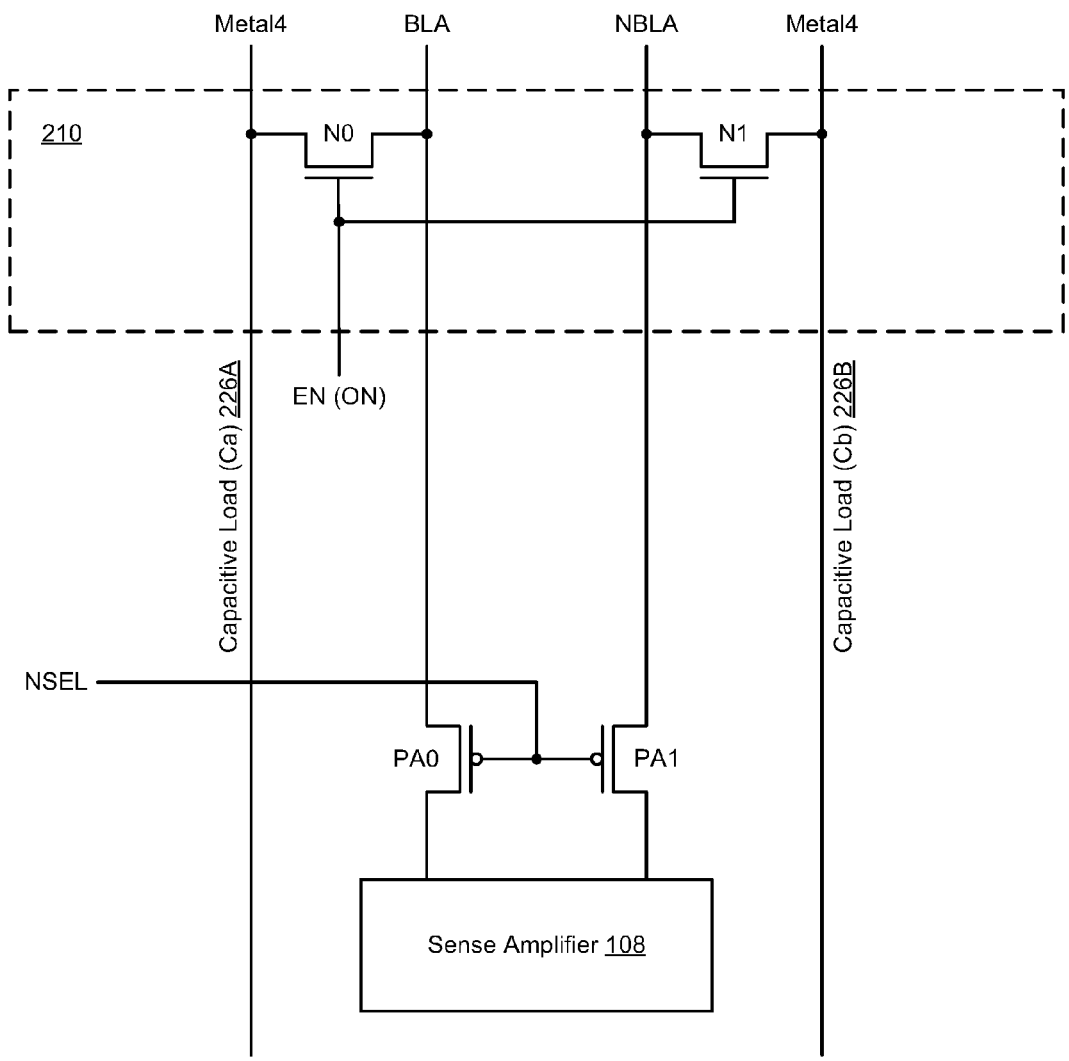

FIGS. 2A-2D illustrate various circuit diagrams 200 of a wordline shape enhancer 210 in accordance with various implementations described herein. In particular, FIG. 2A illustrates a first circuit diagram 200A of the wordline shape enhancer 210 with first capacitive loads 220A, 220B. FIG. 2B illustrates a second circuit diagram 200B of the wordline shape enhancer 210 with second capacitive loads 222A, 222B. FIG. 2C illustrates a third circuit diagram 200C of the wordline shape enhancer 210 with third capacitive loads 224A, 224B. Further, FIG. 2D illustrates a fourth circuit diagram 200D of the wordline shape enhancer 210 with fourth capacitive loads 226A, 226B.

Figure 1:
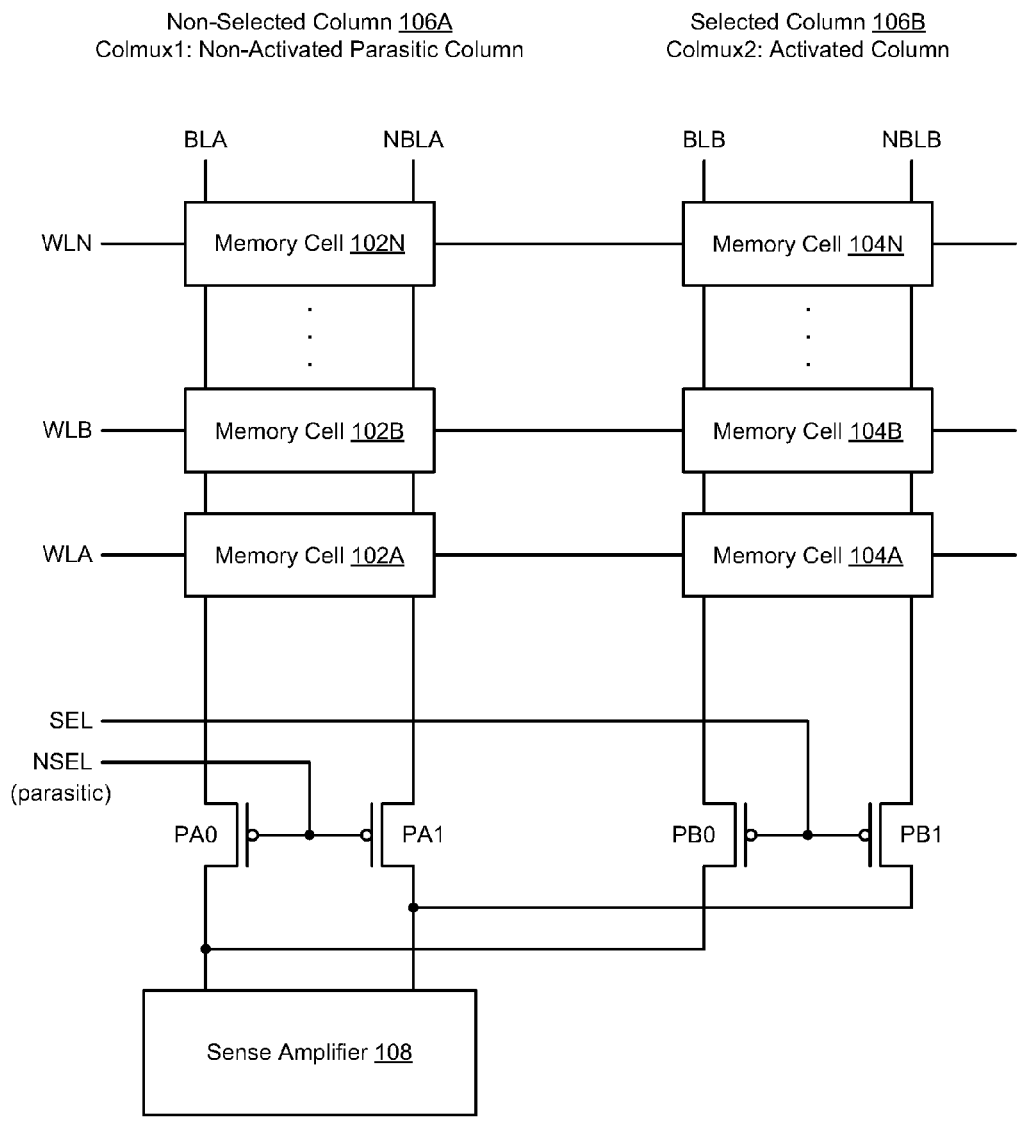
FIG. 1 illustrates a conventional memory cell as known in the art.

Further, FIGS. 2A-2D illustrate a portion of the memory cell array 100 of FIG. 1, wherein the wordline shape enhancer 210 is implemented and disposed between the first column mux passgates PA0, PA1 and the memory cells 102A, 102B, ..., 102N of the non-selected column 106A. However, in various implementations, each of the columns of a memory cell array would include the wordline shape enhancer 210, wherein in non-selected columns, the wordline shape enhancer 210 would be enabled (activated), and wherein in selected columns, the wordline shape enhancer 210 would be disabled (non-activated or deactivated).

As shown in reference to FIG. 2A, the first circuit diagram 200A includes the wordline shape enhancer 210 with the first capacitive loads 220A, 220B. The wordline shape enhancer 210 may include a pair of passgate transistors P0, P1 coupled between the complementary bitlines BLA, NBLA and the capacitive loads 220A, 220B. In some cases, the passgate transistors P0, P1 may be referred to as wordline shape enhancer passgate transistors. Further, in some scenarios, the pair of passgate transistors P0, P1 are configured to restrict a voltage drop of the column mux passgates PA0, PA1 due to a parasitic read. Therefore, in some scenarios, the wordline shape enhancer 210 may be configured to reduce an impact of a parasitic read on a wordline slope and maintain static noise margin (SNM).

In some implementations, the memory cell array 100 of FIG. 1 may be embodied as a static random access memory (SRAM) cell array. Therefore, each of the memory cells in the memory cell array 100 may be SRAM cells.

As shown in FIG. 2A, the capacitive loads 220A, 220B may be embodied as a metal line Metal4, such as, e.g., in a fourth metal layer (Metal4). For instance, in some cases, the metal line Metal4 may be configured to provide capacitance to each of the pair of passgate transistors P0, P1, such as, e.g., a first capacitive load Ca 220A provided to a first passgate transistor P0 via the metal line Metal4, and a second capacitive load Cb 220B provided to a second passgate transistor P1 via the metal line Metal4.

As shown in FIG. 2B, the capacitive loads 222A, 220B may be embodied with at least one capacitor C0, C1 that is coupled to each of the pair of passgate transistors P0, P1 via the metal line Metal4. For instance, a first capacitor C0 may be coupled to the first passgate transistor P0 via the metal line Metal4, and the second capacitor C1 may be coupled to the second passgate transistor P1 via the metal line Metal4. Further, as shown in FIG. 2B, the first and second capacitors C0, C1 may be coupled between the metal line Metal4 and a voltage supply line, such as, e.g., a source voltage supply line (VDD) or a ground voltage supply line (GND, VSS, 0V).

As shown in FIG. 2C, the capacitive loads 224A, 224B may be embodied with at least one transistor PC1, PC2 that is coupled to each of the pair of passgate transistors P0, P1 via the metal line Metal4. In some cases, each of the transistors PC0, PC1 may be interconnected to function as a capacitor. For instance, a first transistor PC0 may be coupled to the first passgate transistor P0 via the metal line Metal4, and the second transistor PC1 may be coupled to a second passgate transistor P1 via the metal line Metal4. Further, as shown in FIG. 2C, gates of the first and second transistors PC0, PC1 may be coupled to a voltage supply line, such as, e.g., a source voltage supply line (VDD) or a ground voltage supply line (GND, VSS, 0V).

In some cases, as shown in FIGS. 2A-2C, the pair of passgate transistors P0, P1 may be implemented with p-type MOS (PMOS) transistors that are controlled by a first enable signal EN that is active with a first voltage polarity, such as, e.g., active low or negative. However, in other cases, as shown in FIG. 2D, the pair of passgate transistors N0, N1 may be implemented with n-type MOS (NMOS) transistors that are controlled by a second enable signal EN that is active with a second voltage polarity that is different than or opposite to the first voltage polarity, such as, e.g., active high or positive.

Further, as shown in FIG. 2D, the fourth capacitive loads 226A, 226B may be embodied with the pair of NMOS passgate transistors N0, N1 coupled to the metal line Metal4. For instance, a first NMOS passgate transistor N0 may be coupled between the bitline BLA and the metal line Metal4, and a second NMOS passgate transistor N1 may be coupled between the bitline NBLA and the metal line Metal4.

In some cases, use of NMOS transistors may assist with shaping the wordline trigger signal and possibly bound the descent of the bitlines (~Vt). This may significantly improve SNM. Further, in some cases, after the Vt drop on the bitlines, the rising edge of the wordline may be inhibited, leading to an improved wordline shape. Further, in some cases, in reference to FIG. 2D, the capacitance of metal4 may be removed, and the NMOS passgate transistors N0, N1 may be directly connected to the source voltage supply line VDD. Thus, for instance, the NMOS passgate transistors N0, N1 may accept a 1Vt bitline drop and not any further, thus improving the wordline shape.

Generally, there are two types of data storage structures: one-wordline devices and multi-wordline devices. One wordline devices (e.g., SRAM) refer to a device having only one access port, which may be referred to as an access device. The bitlines may be single rail (one-bitline devices) or dual rail (multi-bitline devices). The device types (e.g., PMOS and NMOS) may be referred to as access port transistors, which may not be productively split within a bitcell. These devices may be varied between different arrays. In various implementations, Static-RAM bitcells may include a 5T bitcell, a 4T 2R bitcell, a 6T bitcell, etc., which may have access ports that are controlled by one or more wordlines. Further, in some instances, multi-wordlines may result in multiple access ports into a single bitcell.

In some implementations, Port A and Port B (not shown) refer to dual rail bitline ports that are associated with the wordline WL and an associated complementary bitline BLA, BLB. Each of these ports A and B may be used for either a write, a read (in some instances, one port may be a write port, and one port may be a read port), or both functions per port, such as in a dual port. For instance, in a dual port device, each bitline may have both a read and write function depending on the specific implementation.

In accordance with various implementations described herein, the memory cell having the wordline shape enhancer has improved stability and speed by making use of some extra capacitance that is coupled to non-active bitlines. As such, the wordline shape enhancer may be configured to restrict a voltage drop due to a parasitic read, and reduce disturbances that may be caused by this parasitic drop on the wordline rising edge. The wordline shape enhancer may also reduce an impact of the parasitic read on a wordline slope and thus maintain static noise margin (SNM). As a result, a faster and cleaner wordline trigger may allow for faster reads and writes and thus a faster memory.

In reference to power consumption, the wordline shape enhancer may consume less power than the conventional selective precharge method, except maybe during a first cycle where the extra load is precharged. After this first cycle, this extra load should be precharged again, but only to compensate for charge loss due to a parasitic read. Apart from this first cycle, the wordline shape enhancer may consume less power because the bitlines are still being discharged, and therefore the Vds of the bitcell pull-down device is reducing during discharge. Whereas, with the conventional selective precharge method, current going through the bitline typically remains constant. For one of ordinary skill in the art, it may be obvious that various implementations of the wordline shape enhancer may not be limited to using a bitline pre-charge to VDD. Other bitline precharge schemes may include but are not limited to precharging the bitline to VDD-Vt, or VDD/2, etc.

Thus, compared to conventional architecture, the faster wordline may reduce an operating margin, where a difference in speed between first and last columns of the memory is less if the wordline is faster. As such, with the wordline shape enhancer, less margin may be involved. Further, the faster wordline may compensate for the extra power due to the additional load. In some cases, speed of the memory may be bounded by the slowest column, such as the last column. In this instance, the wordline shape enhancer may improve the speed of the latest column and thus the entire memory.

In reference to area, the amount of extra surface space used for implementing the wordline shape enhancer may depend on the type of memory. For instance, in register files, where a bitcell may be somewhat large, there may be enough spacing in the Metal4 layer to be able to implement the extra capacitance without further cost in area.

Figure 3:
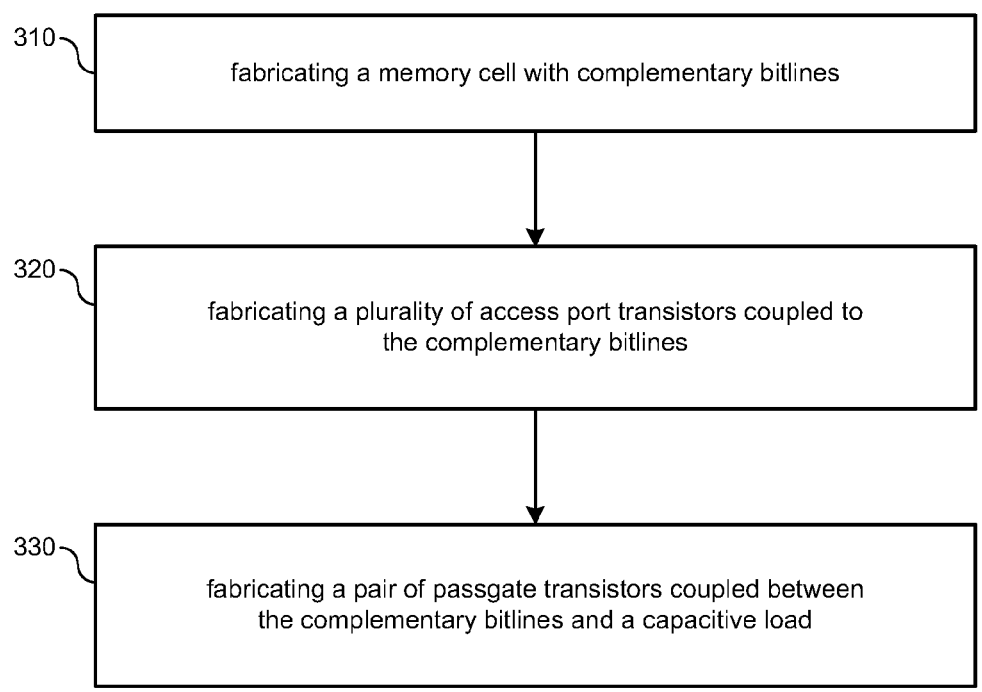
FIG. 3 illustrates a method for fabricating a memory cell with a wordline shape enhancer in accordance with various implementations described herein.

FIG. 3 illustrates a method for fabricating a memory cell with a wordline shape enhancer in accordance with various implementations described herein.

It should be understood that even though method 300 may indicate a particular order of execution of operations, in some instances, various certain portions of the operations may be executed in a different order, and on different systems. In some other instances, additional operations or steps may be added to and/or omitted from method 300. The method 300 may be implemented in hardware and/or software. If implemented in hardware, the method 300 may be implemented with various circuit components, such as described herein above in reference to FIGS. 2A-2D. If implemented in software, the method 300 may be implemented as a program or software instruction process that may be configured to provide level shifting as described herein. Further, if implemented in software, instructions related to implementing the method 300 may be stored in memory and/or a database. For instance, a computer or various other computing devices having a processor and memory may be configured to perform method 300.

In some implementations, method 300 is directed to fabricating a memory cell (or device) with a wordline shape enhancer. For instance, at block 310, method 300 may fabricate a memory cell with complementary bitlines.

At block 320, method 300 may fabricate a plurality of column multiplexor transistors (or passgates) coupled to the complementary bitlines. In some cases, the memory cell or device may be referred to as a data storage structure. In some cases, the memory cell or device may be fabricated as a column of bitcells in an array of bitcells, and the column of bitcells is a non-selected column of bitcells in the array of bitcells. In some cases, the memory cell or device may be fabricated as a column of SRAM cells in an array of SRAM cells, and the column of SRAM cells is a non-selected column of SRAM cells in the array of SRAM cells.

In some implementations, the column multiplexor transistors may be PMOS transistors that are controlled by a first selection signal that is active with a first voltage polarity. In some other implementations, the column multiplexor transistors may be NMOS transistors that are controlled by a second selection signal that is active with a second voltage polarity that is different than or opposite to the first voltage polarity.

At block 330, method 300 may fabricate a pair of passgate transistors coupled between the complementary bitlines and a capacitive load. In some cases, the pair of passgate transistors are configured to restrict a voltage drop of the column multiplexor transistors due to a parasitic read. Further, in some cases, the pair of passgate transistors may be configured to reduce an impact of a parasitic read on a wordline slope and maintain static noise margin (SNM).

In some implementations, the capacitive load may be embodied as a metal line. In some other implementations, the capacitive load may be embodied with at least one capacitor coupled to each of the pair of passgate transistors. Further, in some cases, the at least one capacitor may be a transistor interconnected to function as a capacitor.

In some implementations, the pair of passgate transistors may include PMOS transistors that are controlled by a first enable signal that is active with a first voltage polarity. In some other implementations, the pair of passgate transistors may include NMOS transistors that are controlled by a second enable signal that is active with a second voltage polarity that is different than or opposite to the first voltage polarity.

Described herein are various implementations of a circuit having a data storage structure with column multiplexor transistors coupled to complementary bitlines. Further, the circuit may include a wordline shape enhancer having a pair of passgate transistors coupled between the complementary bitlines and a capacitive load.

Described herein are implementations of a memory device having a plurality of column multiplexor transistors coupled to complementary bitlines. Further, the memory device may include a pair of passgate transistors coupled between the complementary bitlines and a capacitive load. The pair of passgate transistors may restrict a voltage drop across the column multiplexor transistors due to a parasitic read.

Described herein are various implementations of a memory device having a column of bitcells with column multiplexor transistors coupled to complementary bitlines. The memory device may include a wordline shape enhancer having a pair of passgate transistors coupled between the complementary bitlines and a capacitive load. Further, the wordline shape enhancer may reduce an impact of a parasitic read on a wordline slope and maintain static noise margin (SNM).

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A circuit, comprising:
a data storage structure having column multiplexor transistors coupled to complementary bitlines; and
a wordline shape enhancer having a pair of passgate transistors coupled between the complementary bitlines and a capacitive load,
wherein the pair of passgate transistors restrict a voltage drop of the column multiplexor transistors due to a parasitic read.

2. The circuit of claim 1, wherein the data storage structure comprises a column of bitcells.

3. The circuit of claim 2, wherein the column of bitcells is a non-selected column of bitcells in an array of bitcells.

4. The circuit of claim 1, wherein the data storage structure comprises a column of static random access memory (SRAM) cells.

5. The circuit of claim 4, wherein the column of SRAM cells is a non-selected column of SRAM cells in an array of SRAM cells.

6. The circuit of claim 1, wherein the capacitive load comprises a metal line.

7. The circuit of claim 1, wherein the capacitive load comprises at least one capacitor coupled to each of the pair of passgate transistors.

8. The circuit of claim 7, wherein the at least one capacitor comprises a transistor interconnected to function as a capacitor.

9. The circuit of claim 1, wherein the column multiplexor transistors comprise p-type metal-oxide-semiconductor (PMOS) transistors that are controlled by a selection signal that is active with a first voltage polarity.

10. The circuit of claim 1, wherein the column multiplexor transistors comprise n-type metal-oxide-semiconductor (NMOS) transistors that are controlled by a second selection signal that is active with a second voltage polarity.

11. The circuit of claim 1, wherein the pair of passgate transistors comprise p-type metal-oxide-semiconductor (PMOS) transistors that are controlled by a first enable signal that is active with a first voltage polarity.

12. The circuit of claim 1, wherein the pair of passgate transistors comprise n-type metal-oxide-semiconductor (NMOS) transistors that are controlled by a second enable signal that is active with a second voltage polarity.

13. A circuit, comprising:
a data storage structure having column multiplexor transistors coupled to complementary bitlines; and
a wordline shape enhancer having a pair of passgate transistors coupled between the complementary bitlines and a capacitive load,
wherein the wordline shape enhancer reduces an impact of a parasitic read on a wordline slope and maintains static noise margin (SNM).

14. A memory device, comprising:
a plurality of column multiplexor transistors coupled to complementary bitlines; and
a pair of passgate transistors coupled between the complementary bitlines and a capacitive load,
wherein the pair of passgate transistors restrict a voltage drop across the column multiplexor transistors due to a parasitic read.

15. The memory device of claim 14, wherein the capacitive load comprises a metal line.

16. The memory device of claim 14, wherein the capacitive load comprises at least one capacitor coupled to each of the pair of passgate transistors.

17. The memory device of claim 16, wherein the at least one capacitor comprises a transistor interconnected to function as a capacitor.

18. A memory circuit, comprising:
a column of bitcells having column multiplexor transistors coupled to complementary bitlines; and
a wordline shape enhancer having a pair of passgate transistors coupled between the complementary bitlines and a capacitive load,
wherein the wordline shape enhancer reduces an impact of a parasitic read on a wordline slope and maintains static noise margin (SNM).

19. The memory circuit of claim 18, wherein the column of bitcells is a column of static random access memory (SRAM) cells, and wherein the column of SRAM cells is a non-selected column of SRAM cells in an array of SRAM cells.

* * * * *